United States Patent

Degani et al.

[11] Patent Number: 5,516,728
[45] Date of Patent: May 14, 1996

[54] PROCESS FOR FABIRCATING AN INTEGRATED CIRCUIT

[75] Inventors: Yinon Degani, Highland Park; Dean P. Kossives, Glen Gardner, both of N.J.

[73] Assignee: AT&T Corp., Murray Hill, N.J.

[21] Appl. No.: 220,771

[22] Filed: Mar. 31, 1994

[51] Int. Cl.$^6$ .................................................. H01L 21/302
[52] U.S. Cl. .................. 437/227; 437/226; 148/DIG. 28
[58] Field of Search .................................... 437/225, 226, 437/227, 229; 148/DIG. 28; 156/250; 427/289, 293

[56] References Cited

U.S. PATENT DOCUMENTS

| | | | |
|---|---|---|---|
| 3,699,644 | 10/1972 | Cocca | 437/227 |
| 4,720,317 | 1/1988 | Kuroda et al. | 456/250 |
| 5,393,706 | 2/1995 | Mignardi et al. | 437/227 |

FOREIGN PATENT DOCUMENTS

| | | | |
|---|---|---|---|
| 52-58446 | 5/1977 | Japan | 437/227 |
| 59-3943 | 1/1984 | Japan | 437/227 |
| 59-94434 | 5/1984 | Japan | 437/227 |
| 62-112348 | 5/1987 | Japan | 437/227 |

OTHER PUBLICATIONS

Patent Abstracts of Japan, vol. 009, No. 131 (E–319, 6 Jun. 1985 & JP–A–60 016442 (Hitachi Seisakusho KK) 28 Jan. 1985.

Primary Examiner—George Fourson
Assistant Examiner—S. Mulpuri
Attorney, Agent, or Firm—Richard J. Botos

[57] ABSTRACT

A process for fabricating devices is disclosed. Numerous devices are formed on a substrate. The substrate is then placed on an adhesive tape mounted on a dicing ring. The devices are then separated into individual chips by dicing the substrate. Prior to dicing, the substrate is coated with a material that is relatively insoluble in water. After the substrate is diced, the coating is removed by rinsing the substrate with an organic solvent in which the material is substantially soluble. The organic solvent dissolves the coating but does not dissolve the adhesive on the tape or otherwise adversely effect the adhesion between the tape and the substrate.

23 Claims, 1 Drawing Sheet

PROCESS FOR FABIRCATING AN INTEGRATED CIRCUIT

TECHNICAL FIELD

The invention is directed to a process for device fabrication in which multiple integrated circuits are fabricated on a single substrate and then separated into individual chips by dicing.

ART BACKGROUND

In device fabrication, numerous individual integrated circuits, also referred to as chips, are fabricated on a single substrate or wafer. It is also known to form a plurality of multichip modules (MCM's) on a single substrate or wafer. These integrated circuits or MCM's are then separated for individual use. The chips or MCM's are separated by techniques such as dicing, wherein an extremely precise saw is used to separate the individual devices from each other. A dicing saw is one example of an apparatus that is used for dicing substrates into individual chips. One skilled in the art will recognize that other apparatus that are not specifically enumerated herein are also used for this purpose.

Debris is generated during dicing, and the debris is deposited on the diced devices. This debris will adversely affect device performance if it is deposited on certain areas of the device and not removed therefrom. Dicing debris are particularly problematic for devices which are, when in use, spaced from a substrate. An example of such a device is a "flip chip" multichip module, which is illustrated in FIG. 1. The device 20 is affixed to the substrate 10 by, for example, solder bumps 23. Since the bumps 23 have a smaller surface area than the device 20, there is a space 25 between the device 20 and the substrate 10. The space 25 between the silicon chip integrated circuit 20 and the silicon substrate 10 in such a device is typically several mils. If debris becomes lodged in the space 25 during dicing, it can become dislodged during subsequent processing and find its way onto or into a device surface. Once debris is lodged in this space, however, it is difficult to remove using conventional means such as rinsing.

A dicing process in which the device is protected by a polyimide film is disclosed in Japanese Patent Application No. 02-1248 to Kazuyasu Yoneyama. The polyimide coating is applied over the dicing grooves prior to dicing, and removed thereafter. Although the polyimide film prevents the substrate from cracking during the dicing process, the polyimide is difficult to remove. The polyimide film prevents cracks from forming in the substrate near the cut, but, because the polyimide film is deposited over the dicing groove only and is not deposited over the entire surface, it does not prevent dicing debris from accumulating on the uncoated surface of the device.

Japanese Patent Application No. Sho 61 [1986]-96585 describes a process in which a wafer is protected from dicing debris by a coat of photosensitive material that is applied on the wafer prior to dicing. The photosensitive material is described as silicon resin. The photosensitive material is exposed to radiation prior to dicing. The exposed portion of the photosensitive material overlies an electrode on the device. After dicing, the exposed portion of the photosensitive material is removed to provide access to the electrode. The unexposed portion of the photosensitive material is not removed. Consequently, any dicing debris that becomes embedded in the unexposed portion of the photosensitive material during the dicing process is likewise not removed.

SUMMARY OF THE INVENTION

The invention relates to a process for device fabrication. Specifically, the process relates to dicing a substrate, typically a silicon wafer, having a plurality of devices such as integrated circuits formed on the surface thereof. Integrated circuits and "flip chips" that are used in multichip modules are examples of such devices.

A protective coating is applied over the devices prior to dicing to prevent debris generated by the cutting action of the dicing apparatus from being deposited on or embedded in the device. The protective coating remains on the substrate during dicing, but is easily removed from the substrate after the dicing process is completed. The protective coating is made of a material that accomplishes these objectives.

The substrate is diced using a typical apparatus such as, for example, a diamond scribe, a laser scribe, or a diamond saw. Water is typically used to cool the dicing apparatus during the dicing process. The protective coating is not substantially dissolved by the water used to cool the dicing apparatus. It is advantageous if no more than 10 percent of the coating is removed by the water used to cool the dicing apparatus. This does not include that portion of the coating that is removed by the cutting action of the dicing apparatus. Therefore, the protective coating is made of a material that is substantially insoluble in water, i.e., no more than 10 percent of the coating is removed by the water used to cool the dicing apparatus.

The coating is also easily removed from the substrate after the substrate is diced. However, since the substrate is typically fixed to an adhesive material, i.e., a dicing tape, during the dicing process to keep the diced substrate in place, it is advantageous if the protective coating is removed from the substrate under conditions that do not adversely affect the adhesion of the substrate to the adhesive material. It is also advantageous if the coating is removed under conditions that do not cause the adhesive material to deteriorate physically. Typically, tape adhesives are not dissolved by the more polar organic solvents such as the lower alkyl alcohols. It is advantageous if a lower alkyl alcohol such as methanol, ethanol, and propanol is used to rinse the protective coating from the substrate. Therefore, it is advantageous if the protective coating is made of a material that is substantially soluble in such polar organic solvents, i.e., the protective coating is dissolved by these solvents.

Dicing streets are placed on the substrate surface to guide the dicing apparatus. Since the protective coating is applied over these dicing streets, the protective coating must be sufficiently transparent so that the dicing streets remain visible. Therefore, the protective coating is made of a material that forms an at least semi-transparent coating on the substrate surface.

Protective coatings with the above-identified properties are made of a material with an organic moiety and a polar group. Examples of suitable organic moieties include aliphatic moieties and aromatic moieties. Examples of suitable polar functional groups include hydroxyl groups, carbonyl groups, and carboxyl groups. Examples of materials in which the polar functional group is a carbonyl group include aldehydes, ketones, esters, and anhydrides of carboxylic acids.

Rosin-containing materials are one example of these materials. Rosin-containing materials are materials that contain rosins or derivatized rosins. Specific examples of suitable rosins include rosin gum, abietic acid, hydrogenized rosin and dimerized rosin. Other examples of such materials include benzoic anhydride, 2,2'-biphenol and 2-hexadecanone. A coating of these materials is formed on the substrate by known techniques such as spin-coating, brushing or a hot-melt technique. For certain of these techniques, e.g., spin-coating, it is advantageous if the coating material is dissolved in a solvent to facilitate the application of the coating onto the substrate.

DETAILED DESCRIPTION

A process for dicing substrates is disclosed. In the process, a protective coating is deposited over a substrate. The substrate typically has a plurality of devices formed thereon. The coating is dried on the substrate, and the substrate is then diced to separate the devices formed on the substrate. The protective coating is made of a material that is substantially insoluble in water, substantially soluble in polar organic solvents, and that forms a substantially transparent coating on the substrate.

Figure 2:
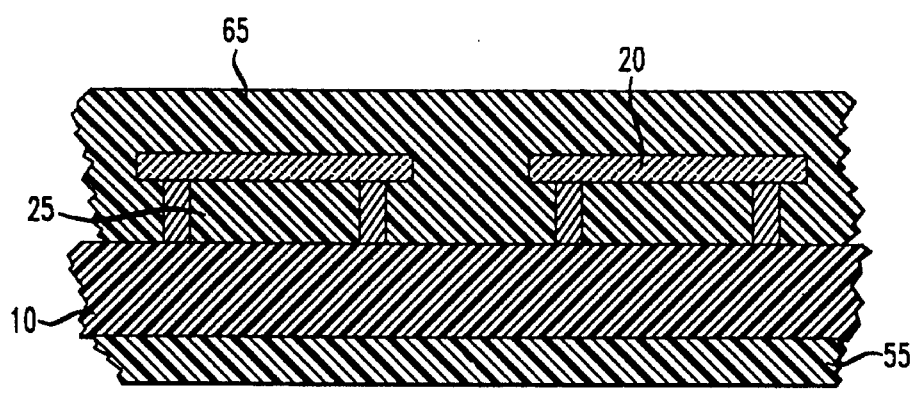
FIG. 2 is a side view of a flip-chip multichip module with a protective coating thereover.

As depicted in FIG. 2, a protective-coating 65 is applied over the substrate 10. The substrate 10 typically has a plurality of devices 20 formed thereon. Although two devices 20 are depicted in FIG. 2, two or more devices are typically formed on the substrates that are diced by the process of the present invention. Although a flip chip module is depicted as the device in FIG. 2, it is contemplated that the process will be used to protect all types of semiconductor devices during the dicing process. Consequently, the substrate 10, typically has integrated circuit chips or other discrete devices either attached to its surface (as depicted in FIG. 2) or formed directly on its surface.

Figure 3:
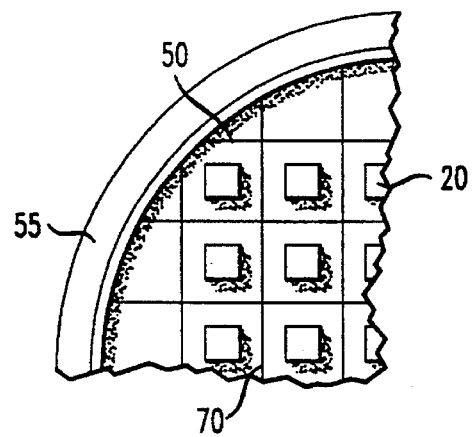
FIG. 3 is a top view of a wafer with individual chips formed thereon on a dicing tape.

Prior to dicing, the coated substrate 10 with individual devices 20 formed thereon, is placed on an adhesive dicing tape 55. If the protective coating becomes sticky or otherwise begins to melt at a temperature which is below the temperature to which the substrate is heated when fixed to the adhesive dicing tape, i.e., a temperature of about 50° C. to about 70° C., then the substrate is fixed to the dicing tape before the protective coating is applied thereon. The adhesive tape 55 retains the substrate 10 in position during the dicing process. Such tape 55 is commercially available and is known to those skilled in the art of dicing substrates. The substrate 10 is placed on the side of the tape 55 with adhesive thereon. The coating is at least semi-transparent, so that the dicing lines 70 (FIG. 3) on the substrate 10 are visible during the dicing process.

After the coated substrate is mounted on the tape it is placed in a dicing apparatus. How the substrate is placed in the dicing apparatus and the type of dicing apparatus that is used is a matter of design choice which is readily made by one skilled in the art. Dicing apparatus frequently utilize water to cool the substrate while it is being diced. The protective coating, however, is relatively insoluble in water, i.e., it is not substantially dissolved by water. In this regard it is advantageous if water removes no more than 10 volume percent of the rosin-containing material not otherwise removed from the substrate by the action of the dicing saw. Therefore, the coating remains on the substrate during the dicing process.

As the substrate is diced, the protective coating prevents dicing debris from being deposited on the substrate surface. If the device on the substrate being coated is a multichip module, the coating also prevents dicing debris from becoming embedded in the space 25 between the substrate 10 and the flipped silicon chip 20. The dicing debris can damage the devices on the substrate, or otherwise adversely affect their performance. Debris that is embedded in the protective coating is removed from the substrate when the protective coating itself is removed from the substrate after dicing.

Many organic solvents will dissolve the protective coating. However, only certain solvents will dissolve the protective coating but will not adversely affect the adhesion between the substrate and the support material or otherwise structurally degrade the tape to a significant degree. Generally the lower alkyl alcohols, wherein the alkyl group contains about 4 or less carbon atoms, dissolve the protective coating but do not adversely affect either the tape or the substrate-tape adhesion to a significant degree. Methanol, ethanol, propanol, and isopropanol are examples of suitable solvents. By using a solvent that does not adversely affect adhesion, the diced substrate remains on the support material until the individual, diced devices are utilized.

Protective coatings with the above-identified properties are made of a material with an organic moiety and a polar group. Examples of suitable organic moieties include aliphatic moieties and aromatic moieties. Examples of suitable polar functional groups include hydroxyl groups, carbonyl groups, and carboxyl groups. Generally materials that contain polar carbonyl functional groups include aldehydes, ketones, esters, and anhydrides of carboxylic acids.

Rosin-containing materials are one example of a suitable protective coating material. Rosins are typically a mixture of several different compounds, one of which is typically a resin acid. These materials are described in many references, including *The Condensed Chemical Dictionary*, p. 900 (Gessner G. Hawley, ed.,10th ed. 1981) and *Kirk-Othmer Encylopedia of Chemical Technology*, 22:531–533 (3rd ed. 1980) which are incorporated by reference herein. Examples of resin acids include abietic acid and pimaric acid. Derivatized rosins are rosins that contain resin acid derivatives such as dimerized resin acids or hydrogenated resin acids.

It is contemplated that rosin-containing materials suited for use in the process of the present invention also contain other carboxylic acids. All of the rosin-containing materials suited for use in the process of the present invention have the general properties of being substantially insoluble in water and substantially soluble in organic solvents. These materials are also capable of being formed into a coating on a substrate. The rosin-containing materials are at least semi-transparent when a coating of these materials is formed on the substrate. Suitable rosin-containing materials are available commercially. An example of a suitable material is Rosin Gum, which is obtained from the Aldrich Co. in Milwaukee, Wis.

Examples of other materials suitable for use as the protective coating in the process of the present invention are benzoic anhydride and 2-hexadecanone. Since the melting point of these materials is less than about 60° C., the temperature to which the substrate is heated when affixed to the dicing tape, these materials are coated on the substrate after the substrate is affixed to the dicing tape. Although 2,2' biphenol, which is another suitable protective coating material, has a melting temperature above about 60° C., it is also advantageous to coat this material onto the substrate after the substrate has been fixed to the dicing tape. This is because the 2,2' biphenol demonstrates stickiness at the temperature at which the wafer is fixed to the substrate. Since the melting temperature of rosin-containing materials is typically well above about 70° C., rosin-containing materials are coated on the substrate before the substrate is affixed to the dicing tape.

The protective coating is applied onto the substrate in a number of different ways such as spin coating, spraying, brushing and hot melting of the solid material on the substrate surface. All of these coating methods are conventional. Since the coating materials are typically solid at room temperature, it is contemplated that a solvent is mixed with the coating material to aid in applying the material to the substrate. The amount of solvent that is added depends upon the desired coating consistency and the manner in which the coating is applied to the substrate. This solvent is driven off after application to harden the coating material. The solvent is driven off by conventional means.

For example, to spin coat the substrate with the coating material, the coating is mixed with a spinning solvent. The spinning solvent will substantially dissolve the coating material but will evaporate after the coating is applied onto the substrate. The solution of the coating material dissolved in a solvent is referred to as a spin-coatable material. Alcohols such as methanol, ethanol, isopropanol, and the like and ketones such as acetone and methyl ethyl ketone are contemplated as suitable solvents. Other suitable solvents will be apparent to those skilled in the art.

One skilled in the art will determine the amount of solvent needed to provide a spin-coatable material with the desired consistency. If the coating material is applied by certain techniques such as brushing, it is also contemplated that the coating will be combined with a solvent to make the coating easier to apply to the substrate. If a technique such as spraying is used, a coating material with a more liquid consistency than spin-coatable materials is desired.

The thickness of the coating will vary depending upon the characteristics of the substrate and the devices formed thereon. Since the object of the process is to protect the devices from dicing debris, it is advantageous if the thickness of the coating is sufficient to substantially cover the devices on the substrate. It is also contemplated that additives such as polypropylene glycol or other polyalkylene glycols or surfactants will be incorporated into the coating material. These additives soften the coating making it more resilient and easier to remove. The amount of such an additive that is mixed with the coating materials is readily apparent to one skilled in the art.

If the protective coating is applied onto the substrate using techniques such as brushing or hot melting, it is not necessary to combine the coating material with a solvent. For example, if a rosin-containing material is applied onto the substrate and then heated to a temperature of at least about 120° C., the rosin-containing material will melt over the substrate to form a coating thereover. It is advantageous if the rosin-containing material is heated to about 150° C. to about 160° C. to accomplish this result.

It is contemplated that a variety of formulations will be used in the process described herein. One skilled in the art will appreciate that a variety of rosin-containing materials, and not just the rosin-containing materials specifically described herein, will work equally effectively in the present process.

EXAMPLE 1

Dicing a Wafer With a Rosin-Containing Protective Coating

Figure 1:
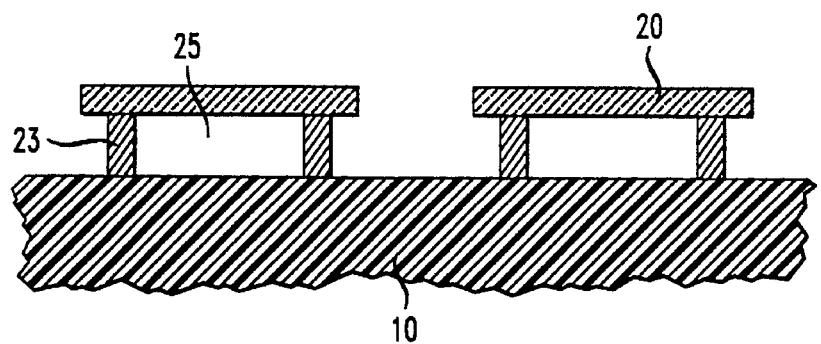
FIG. 1 is a side view of a flip-chip multichip module.

A solution that was 40 weight percent rosin in alcohol was prepared by heating a mixture of rosin gum (40 g) and isopropanol (60 g). The solution was mixed until the rosin was dissolved in the solution. The solution was then cooled to room temperature. A portion of the solution (10 g) was then applied as a coating on a silicon wafer that had 100 multi-chip modules assembled thereon. The rosin was Rosin Gum that was obtained from the Aldrich Co. The multi-chip modules 20 are illustrated in FIG. 1. The wafer was placed in a spin-coating apparatus and rotated at a speed of 100 rpm for 30 seconds to disperse the coating over the wafer surface and remove the excess material.

The coated wafer was then heated to a temperature of about 100° C. on a hot plate and retained at that temperature for about 3 or 4 minutes. The wafer was then removed from the hotplate, allowed to cool to room temperature and then mounted on a dicing ring with the rosin-coated surface of the wafer facing up. The dicing ring was equipped with a pressure sensitive adhesive tape which held the wafer in place during the dicing process. The pressure sensitive tape was Nitto tape that was obtained from the Semiconductor Equipment Corporation.

The dicing ring was then placed in a dicing apparatus, a Disco Saw obtained from the Disco Corp., and the wafer was diced in a typical manner. After the wafer was diced, the dicing ring with the wafer mounted thereon was immersed in a bath of isopropanol for about 30 seconds. The bath was agitated by the dicing ring to accelerate the removal of particles deposited on the wafer surface during the dicing process and to dissolve the protective coating on the wafer surface. The dicing ring with the wafer mounted thereon was then immersed in a methanol bath for about 30 seconds. Agitation was again used, this time to facilitate removal of any portion of the coating that remained on the substrate. After the dicing ring was removed from the bath, the surface of the wafer was rinsed with deionized water. The wafer surface was dried by blowing nitrogen on the surface of the wafer. The diced wafer remained mounted on the Nitto tape during the process because the process did not degrade the Nitto tape.

EXAMPLE 2

Dicing a Wafer with a Protective Coating of Benzoic Anhydride Thereon

A silicon wafer was mounted onto a dicing ring by a pressure sensitive tape. A solution of benzoic anhydride in isopropanol (3 g of a 10 wt. % solution) was poured on the surface of the silicon wafer. The mounted wafer was then tilted around to allow even spreading of the solution. The mounted wafer was then placed in an oven at 45° C. for 10 minutes to evaporate the isopropanol. The resulting coating was sufficiently clear to allow visual recognition or features on the surface of the silicon wafer. The wafer was then diced using the dicing saw that was described in Example 1. After dicing the mounted diced wafer was placed in a pure methanol bath for one minute and removed. The wet coating remaining was rubbed gently with a methanol wetted cotton swab and the diced wafer was again placed in the methanol bath to remove the remaining portion of the coating. The mounted diced wafer was taken out of the bath, rinsed with deionized water and dried by blowing nitrogen on the surface of silicon.

EXAMPLE 3

Dicing a Wafer with a Protective Coating of 2,2'-Biphenol

A solution of 2,2'-biphenol was prepared (10 wt. %) in isopropanol. The 2,2' biphenol was obtained from the Aldrich Chemical Co. The solution was applied on a wafer and the wafer was diced according to the process described in Example 2.

EXAMPLE 4

Dicing a Wafer With a Protective Coating of Benzoic Anhydride Thereon

A solution of 2-hexadecanone (10 wt. %) in isopropanol was prepared. The 2-hexadecanone was obtained from the Aldrich Chemical Co. The solution was applied onto a wafer and the water was diced according to the process described in Example 2.

We claim:

1. A process for dicing a substrate comprising:

forming an at least semi-transparent coating entirely wherein the substrate has a plurality of devices formed thereon and dicing streets formed therebetween, with a material that is substantially insoluble in water and substantially soluble in alcohol, wherein the material comprises a compound with an organic moiety selected from the group consisting of aliphatic moieties and aromatic moieties and a polar functional group selected from the group consisting of hydroxyl, carbonyl, and carboxyl groups;

dicing the substrate along the dicing streets; and rinsing the coated substrate with an organic solvent to remove the coating from the substrate.

2. The process of claim 1 wherein the compound is a rosin-containing material.

3. The process of claim 2 wherein the rosin-containing material comprises an organic acid selected from the group consisting of resin acids and derivatized resin acids.

4. The process of claim 1 wherein the compound is benzoic anhydride.

5. The process of claim 1 wherein the compound is 2-hexadecanone.

6. The process of claim 1 wherein the compound is 2,2'-biphenol.

7. The process of claim 1 wherein the organic solvent is a lower alkyl alcohol selected from the group consisting of methanol, ethanol, propanol and isopropanol.

8. The process of claim 2 wherein the rosin-containing material is dissolved in a spinning solvent prior to forming the coating on the substrate and the coating is formed on the substrate by spin-coating.

9. A process for fabricating an integrated circuit comprising:

forming a plurality of devices on a substrate;

forming dicing streets between the devices on the substrate; then coating entirely on the substrate with a rosin-containing material that is substantially soluble in alcohol and substantially insoluble in water to form an at least semi-transparent coating on the substrate;

dicing the substrate along the dicing streets; and contacting the coating material with an organic solvent to remove the material from the substrate.

10. The process of claim 9 wherein the rosin-containing material is removed from the substrate by rinsing the rosin-containing material with a lower alkyl alcohol.

11. The process of claim 9 wherein the dicing streets are visible through the semi-transparent material.

12. The process of claim 9 wherein the material comprises benzoic anhydride.

13. The process of claim 9 wherein the material comprises 2-hexadecanone.

14. The process of claim 9 wherein the compound is 2,2'-biphenol.

15. The process of claim 9 further comprising combining the material with a spinning solvent prior to coating the substrate.

16. The process of claim 15 wherein the coating material is about 10 to about 80 weight percent rosin-containing material.

17. The process of claim 15 wherein the coating material is about 20 to about 60 weight percent rosin-containing material.

18. The process of claim 15 wherein the coating material is about 30 to about 50 weight percent rosin-containing material.

19. The process of claim 15 wherein the coating material further comprises an additive to soften the coating.

20. The process of claim 15 wherein the additive is a polyalkylene glycol.

21. The process of claim 9 wherein the substrate is coated with the rosin-containing material by placing the rosin-containing material on the substrate and heating the rosin-containing material to a temperature sufficient to form a coating of melted rosin-containing material over the substrate surface.

22. The process of claim 21 wherein the rosin-containing material is heated to at least about 120° C.

23. The process of claim 9 wherein the rosin-containing material comprises an organic acid selected from the group consisting of resin acids and derivitized resin acids.

* * * * *